(12) United States Patent
Takimoto

(10) Patent No.: US 11,854,840 B2
(45) Date of Patent: Dec. 26, 2023

(54) SUBSTRATE PROCESSING SYSTEM AND SUBSTRATE PROCESSING METHOD

(71) Applicant: Tokyo Electron Limited, Tokyo (JP)

(72) Inventor: Yuji Takimoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 482 days.

(21) Appl. No.: 16/919,463

(22) Filed: Jul. 2, 2020

(65) Prior Publication Data

US 2021/0013056 A1   Jan. 14, 2021

(30) Foreign Application Priority Data

Jul. 8, 2019 (JP) .................................. 2019-126958

(51) Int. Cl.
*H01L 21/06* (2006.01)
*H01L 21/304* (2006.01)
(Continued)

(52) U.S. Cl.
CPC ...... *H01L 21/67034* (2013.01); *H01L 21/304* (2013.01); *H01L 21/306* (2013.01);
(Continued)

(58) Field of Classification Search
CPC ............. H01L 21/67051; H01L 21/306; H01L 21/677; H01L 21/68764; H01L 21/304;
(Continued)

(56) References Cited

U.S. PATENT DOCUMENTS 6,829,056 B1* 12/2004 Barnes .............. H01L 21/67253
 118/728
2005/0233477 A1* 10/2005 Yamazaki ......... H01L 21/67253
 118/712
(Continued)

FOREIGN PATENT DOCUMENTS

JP   2006-203145 A   8/2006
JP   2009-148734 A   7/2009
(Continued)

*Primary Examiner* — Benjamin L Osterhout
(74) *Attorney, Agent, or Firm* — Nath, Goldberg & Meyer; Jerald L. Meyer; Tanya E. Harkins

(57) ABSTRACT

A substrate processing system includes: a substrate transfer device; processing units each having a substrate holding mechanism for rotatably holding a substrate received from the substrate transfer device and a processing fluid supply part for supplying a processing fluid to the substrate; and a controller for controlling the substrate transfer device and the processing units according to processing recipe information so as to execute the substrate processing process. When an abnormality in a certain unit of the processing units occurs in the substrate processing process for the substrate to be processed, the controller controls the substrate transfer device and a relief processing unit according to complementary recipe information so that the complementary processing process for a relief substrate is executed in the relief processing unit by transferring the relief substrate to the relief processing unit different from the certain processing unit.

13 Claims, 9 Drawing Sheets

(51) Int. Cl.
  *H01L 21/306*   (2006.01)
  *H01L 21/687*   (2006.01)
  *H01L 21/677*   (2006.01)
  *H01L 21/67*    (2006.01)

(52) U.S. Cl.
  CPC ...... *H01L 21/677* (2013.01); *H01L 21/67051* (2013.01); *H01L 21/67207* (2013.01); *H01L 21/67253* (2013.01); *H01L 21/68764* (2013.01); *H01L 21/67028* (2013.01); *H01L 21/67288* (2013.01)

(58) Field of Classification Search
  CPC ......... H01L 21/67253; H01L 21/67207; H01L 21/67034; H01L 21/67288; H01L 21/67028
  See application file for complete search history.

(56) References Cited

U.S. PATENT DOCUMENTS

| | | | | |
|---|---|---|---|---|
| 2006/0260746 | A1* | 11/2006 | Ikuhara | H01L 21/67253 156/345.24 |
| 2007/0199655 | A1* | 8/2007 | Yokouchi | H01L 21/67288 156/345.11 |
| 2016/0329224 | A1* | 11/2016 | Yamamoto | H01L 21/67766 |

FOREIGN PATENT DOCUMENTS

| | | |
|---|---|---|
| JP | 2009-200476 A | 9/2009 |
| JP | 2017-011159 A | 1/2017 |

\* cited by examiner

SUBSTRATE PROCESSING SYSTEM AND SUBSTRATE PROCESSING METHOD

CROSS-REFERENCE TO RELATED APPLICATION

This application is based upon and claims the benefit of priority from Japanese Patent Application No. 2019-126958, filed on Jul. 8, 2019, the entire contents of which are incorporated herein by reference.

TECHNICAL FIELD

The present disclosure relates to a substrate processing system and a substrate processing method.

BACKGROUND

In a substrate processing apparatus, a series of substrate processes including a chemical liquid process, a rinsing process, and a drying process are performed according to a predetermined recipe.

When an abnormality occurs in the course of supplying a chemical liquid or the like during the substrate process, the process may be interrupted with a target substrate arranged in a processing unit. In this case, the substrate is discharged from the processing unit by manual or machine during the process. On the other hand, for example, when an abnormality occurs during the chemical liquid process, a chemical liquid (for example, hydrofluoric acid or the like) may adhere to a front surface of the substrate.

In view of such a situation, a technique has been proposed in which, when an abnormality occurs during the substrate process, the process being performed is interrupted, the rinsing process is performed using pure water and the substrate is dried by rotating the substrate (see Patent Document 1). According to this technique, the substrate which has been subjected to the original process until halfway, may be properly recovered, while avoiding an excessive process using the chemical liquid.

PRIOR ART DOCUMENTS

Patent Documents

Patent Document 1: Japanese laid-open publication No. 2009-148734

SUMMARY

According to one embodiment of the present disclosure, there is provided a substrate processing system, including: a substrate transfer device configured to transfer a substrate; a plurality of processing units, each having a substrate holding mechanism configured to rotatably hold the substrate received from the substrate transfer device and a processing fluid supply part configured to supply a processing fluid to the substrate held by the substrate holding mechanism; and a controller configured to control the substrate transfer device and the plurality of processing units according to processing recipe information indicating contents of a substrate processing process so as to execute the substrate processing process including a substrate chemical liquid process of supplying a chemical liquid to the substrate, a substrate rinsing process of supplying a rinsing liquid to the substrate, and a substrate drying process of drying the substrate, wherein, when an abnormality in a certain processing unit of the plurality of processing units occurs in the substrate processing process for the substrate to be processed, the controller is configured to control the substrate transfer device and a relief processing unit according to complementary recipe information indicating contents of a complementary processing process so that the complementary processing process for a relief substrate is executed in the relief processing unit by transferring the relief substrate which is the substrate to be processed to the relief processing unit which is a processing unit different from the certain processing unit.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of a substrate processing system and a substrate processing method will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
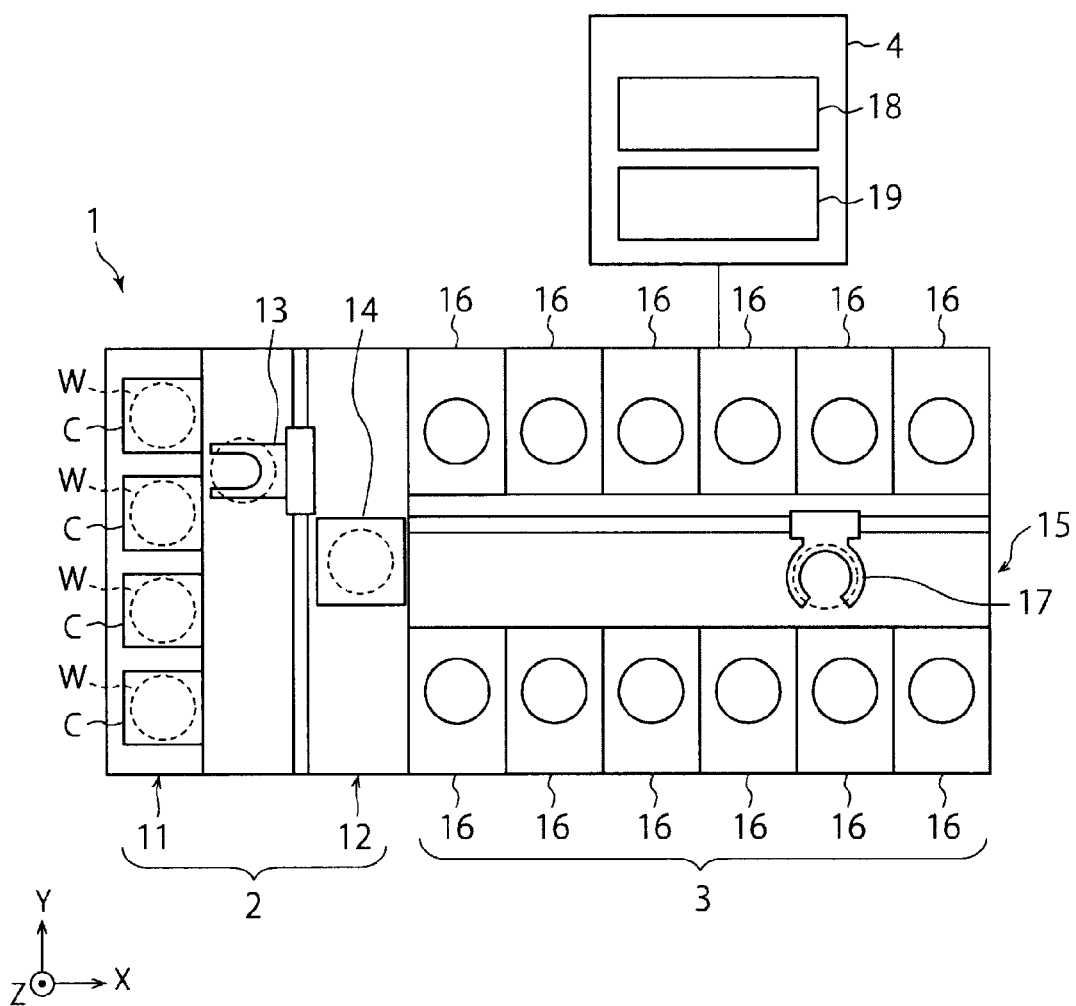
FIG. 1 is a diagram illustrating a schematic configuration example of a substrate processing system.

FIG. 1 is a diagram illustrating a schematic configuration of a substrate processing system according to the present embodiment. For the clarification of a positional relationship, an X-axis direction, a Y-axis direction and a Z-axis direction, which are orthogonal to one another, are defined in the following description and a positive Z-axis direction is defined as a vertical upward direction.

A substrate processing system 1 illustrated in FIG. 1 includes a loading/unloading station 2 and a processing station 3. The loading/unloading station 2 and the processing station 3 are installed adjacent to each other.

The loading/unloading station 2 includes a carrier placement part 11 and a transfer part 12. A plurality of carriers C for accommodating a plurality of substrates (semiconductor wafers (hereinafter, referred to as wafers W) in the present embodiment) in a horizontal posture are placed on the carrier placement part 11.

The transfer part 12 is installed adjacent to the carrier placement part 11, and includes a substrate transfer device 13 and a delivery part 14 provided therein. The substrate transfer device 13 includes a wafer holding mechanism configured to hold the wafer W. Furthermore, the substrate transfer device 13 can move in a horizontal direction and a vertical direction and rotate about a vertical axis so as to transfer the wafer W between the carriers C and the delivery part 14 using the wafer holding mechanism.

The processing station 3 is installed adjacent to the transfer part 12. The processing station 3 includes a transfer part 15 and a plurality of processing units 16. The plurality of processing units 16 are arranged at both sides of the transfer part 15.

The transfer part 15 includes a substrate transfer device 17 provided therein. The substrate transfer device 17 includes a wafer holding mechanism configured to hold the wafer W. Furthermore, the substrate transfer device 17 can move in the horizontal direction and the vertical direction and rotate about a vertical axis so as to transfer the wafer W between the delivery part 14 and the processing units 16 using the wafer holding mechanism.

Each of the processing units 16 performs a predetermined substrate process on the wafer W transferred by the substrate transfer device 17.

In addition, the substrate processing system 1 includes a control device 4. The control device 4 is, for example, a computer, and includes a controller 18 and a storage part 19. The storage part 19 stores a program for controlling various processes executed in the substrate processing system 1. The controller 18 controls operations of the substrate processing system 1 by reading the program stored in the storage part 19 and executing the same.

The program may also be recorded in a non-transitory computer-readable storage medium and installed on the storage part 19 of the control device 4 from the storage medium. The computer-readable storage medium includes, for example, a hard disk (HD), a flexible disk (PD), a compact disc (CD), a magneto-optical disc (MO), a memory card, and the like.

In the substrate processing system 1 configured as described above, first, the substrate transfer device 13 of the loading/unloading station 2 picks up the wafer W from each carrier C placed on the carrier placement part 11 and places the picked-up wafer W on the delivery part 14. The wafer W placed on the delivery part 14 is picked up from the delivery part 14 by the substrate transfer device 17 of the processing station 3 and loaded into the processing unit 16.

The wafer W loaded into the processing unit 16 is processed by the processing unit 16. Thereafter, the wafer W is unloaded from the processing unit 16 by the substrate transfer device 17 and placed on the delivery part 14. Then, the processed wafer W placed on the delivery part 14 is returned to the carrier C of the carrier placement part 11 by the substrate transfer device 13.

Figure 2:
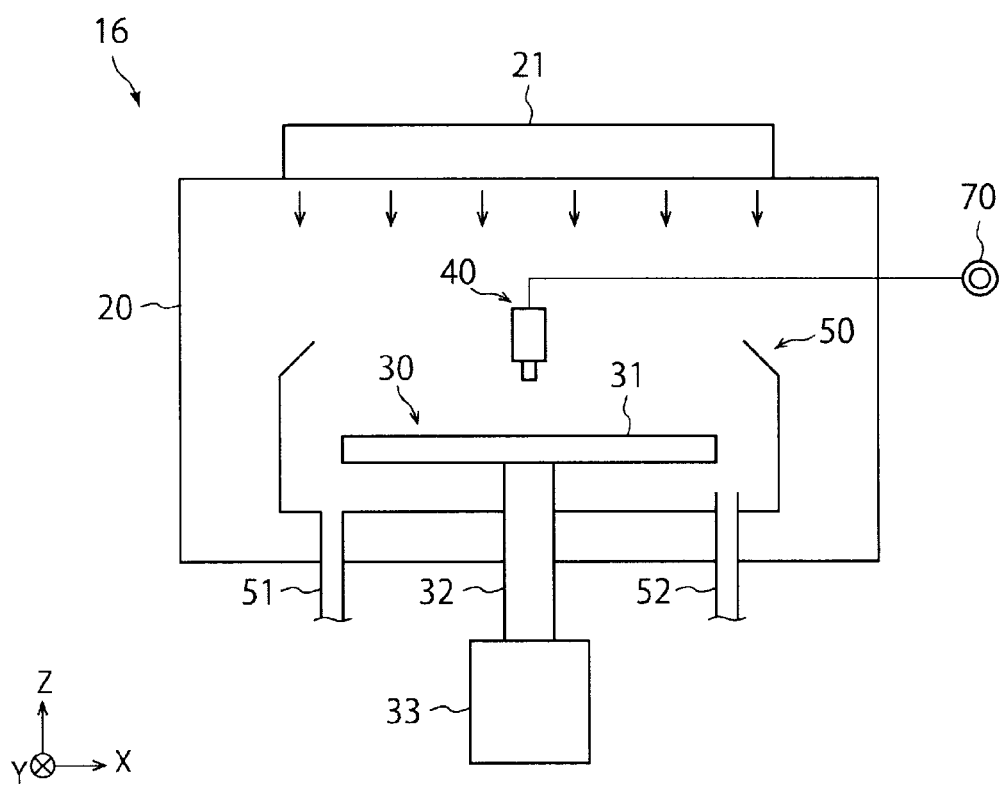
FIG. 2 is a diagram illustrating a schematic configuration example of a processing unit.

Next, a schematic configuration of the processing unit 16 will be described with reference to FIG. 2. FIG. 2 is a diagram illustrating the schematic configuration of the processing unit 16.

As illustrated in FIG. 2, the processing unit 16 includes a chamber 20, a substrate holding mechanism 30, a processing fluid supply part 40, and a recovery cup 50.

The chamber 20 accommodates the substrate holding mechanism 30, the processing fluid supply part 40, and the recovery cup 50. A fan filter unit (FFU) 21 is installed on a ceiling of the chamber 20. The FFU 21 forms a down-flow inside the chamber 20.

The substrate holding mechanism 30 includes a holding part 31, a pillar part 32, and a driving part 33. The holding part 31 horizontally holds the wafer W. The pillar part 32, which is a member extending in the vertical direction, has a base end portion rotatably supported by the driving part 33 and a leading end portion horizontally supporting the holding part 31. The driving part 33 rotates the pillar part 32 about a vertical axis. The substrate holding mechanism 30 rotates the holding part 31 supported by the pillar part 32 by rotating the pillar part 32 using the driving part 33, so as to rotate the wafer W held by the holding part 31.

The processing fluid supply part 40 supplies a processing fluid to the wafer W. The processing fluid supply part 40 is connected to a processing fluid source 70.

The recovery cup 50 is arranged so as to surround the holding part 31, and collects the processing liquid scattering from the wafer W with the rotation of the holding part 31. A drainage port 51 is formed in the bottom of the recovery cup 50. The processing liquid collected by the recovery cup 50 is discharged from the drainage port 51 outward of the processing unit 16. In addition, an exhaust port 52 is formed in the bottom of the recovery cup 50 to discharge a gas supplied from the FFU 21 outward of the processing unit 16.

Figure 3:
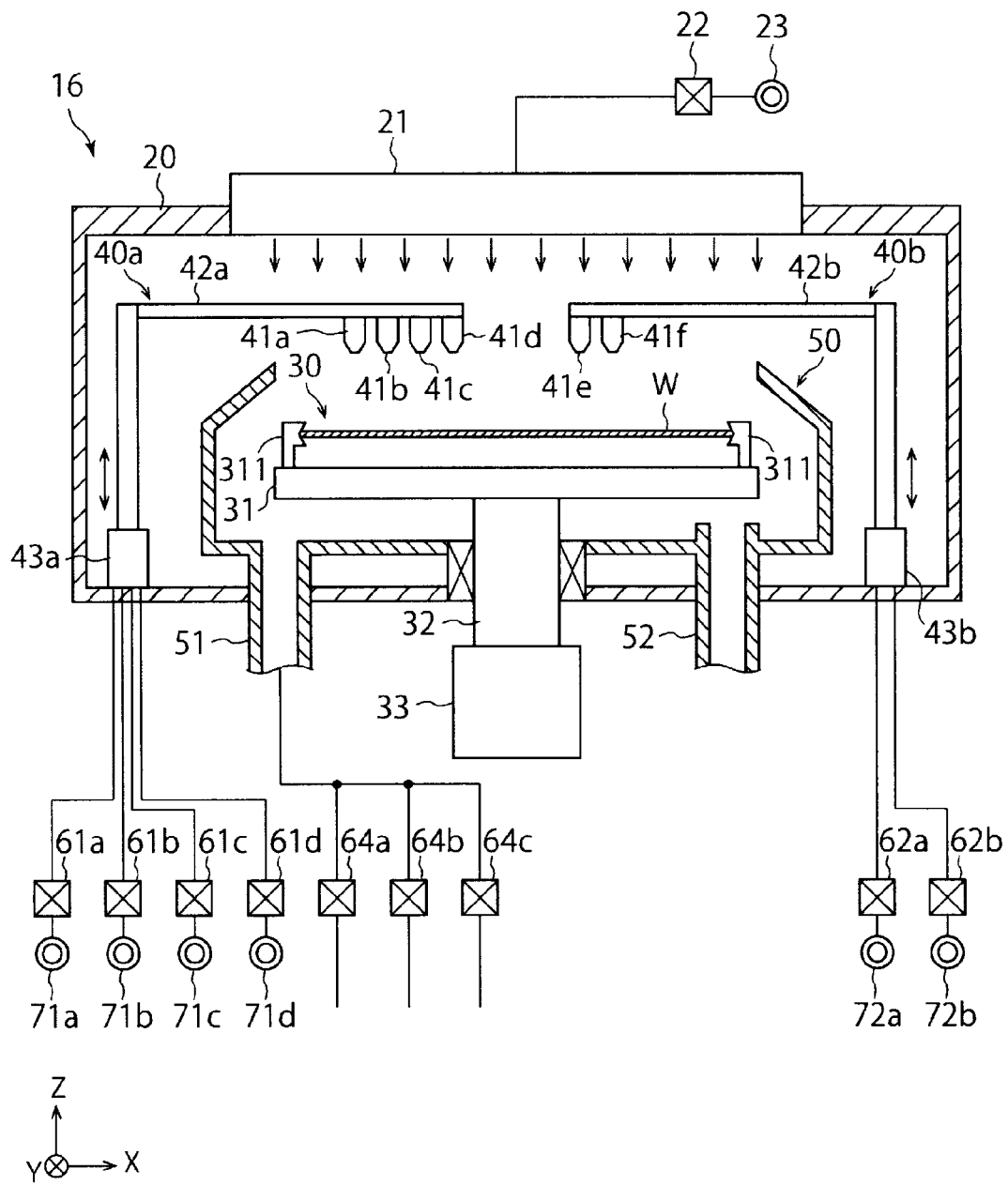
FIG. 3 is a schematic diagram illustrating a specific example of the configuration of the processing unit.

Next, a configuration example of the processing unit 16 will be described with reference to FIG. 3. FIG. 3 is a schematic diagram illustrating a specific example of the configuration of the processing unit 16.

As illustrated in FIG. 3, an inert gas source 23 is connected to the FFU 21 via a valve 22. The FFU 21 discharges an inert gas such as an $N_2$ gas or the like supplied from the inert gas source 23 into the chamber 20.

In addition, a holding member 311 configured to hold the wafer W from a lateral surface of the wafer W is installed on an upper surface of the holding part 31 included in the substrate holding mechanism 30. The wafer W is horizontally held by the holding member 311 while being slightly separated from the upper surface of the holding part 31. In this manner, the substrate holding mechanism 30 rotatably holds the wafer W received from the substrate transfer device 17.

Furthermore, the processing unit 16 includes a first supply part 40a and a second supply part 40b as the processing fluid supply part 40 (see FIG. 2) for supplying the processing fluid to the wafer W held by the substrate holding mechanism 30.

The first supply part 40a includes nozzles 41a to 41d, a first arm 42a for horizontally supporting the nozzles 41a to 41d, and a first rotating/elevating mechanism 43a for rotating and elevating the first arm 42a.

The first supply part 40a supplies diluted hydrofluoric acid (DHF), which is a kind of chemical liquid, from the nozzle 41a to the wafer W. The first supply part 40a supplies deionized water (DIW), which is a kind of rinsing liquid, from the nozzle 41b to the wafer W. The first supply part 40a supplies iso-propyl alcohol (IPA), which is a kind of organic solvent, from the nozzle 41c to the wafer W. The first supply part 40a supplies $N_2$, which is a kind of inert gas, from the nozzle 41d to the wafer W.

Specifically, a DHF source 71a is connected to the nozzle 41a via a valve 61a, a DIW source 71b is connected to the nozzle 41b via a valve 61b, an IPA source 71c is connected to the nozzle 41c via a valve 61c, and an $N_2$ source 71d is connected to the nozzle 41d via a valve 61d.

The second supply part 40b includes nozzles 41e and 41f, a second arm 42b for horizontally supporting the nozzles 41e and 41f, and a second rotation/elevating mechanism 43b for rotating and elevating the second arm 42b.

The second supply part 40b supplies a mixed liquid of DIW, ammonium hydroxide, and hydrogen peroxide (SC1), which is a kind of chemical liquid, from the nozzle 41e to the wafer W, and supplies DIW, which is a kind of rinsing liquid, from the nozzle 41f to the wafer W.

Specifically, a SC1 source 72a is connected to the nozzle 41e via a valve 62a, and a DIW source 72b is connected to the nozzle 41f via a valve 62b.

Furthermore, there has been described an example of a case where the processing fluid sources are installed to correspond to the respective nozzles 41a to 41f, but the processing fluid sources may be properly shared by one another over the nozzles 41a to 41f.

The drainage port 51 formed in the bottom of the recovery cup 50 is connected to three kinds of drainage lines. Specifically, the drainage port 51 is connected to a drainage line for discharging an alkaline liquid via a valve 64a, is connected to a drainage line for discharging an acid liquid via a valve 64b, and is connected to a drainage line for discharging an organic liquid via a valve 64c.

Next, a typical example of a substrate processing method performed by the substrate processing system 1 when an abnormality occurs will be described.

First Embodiment

Figure 4:
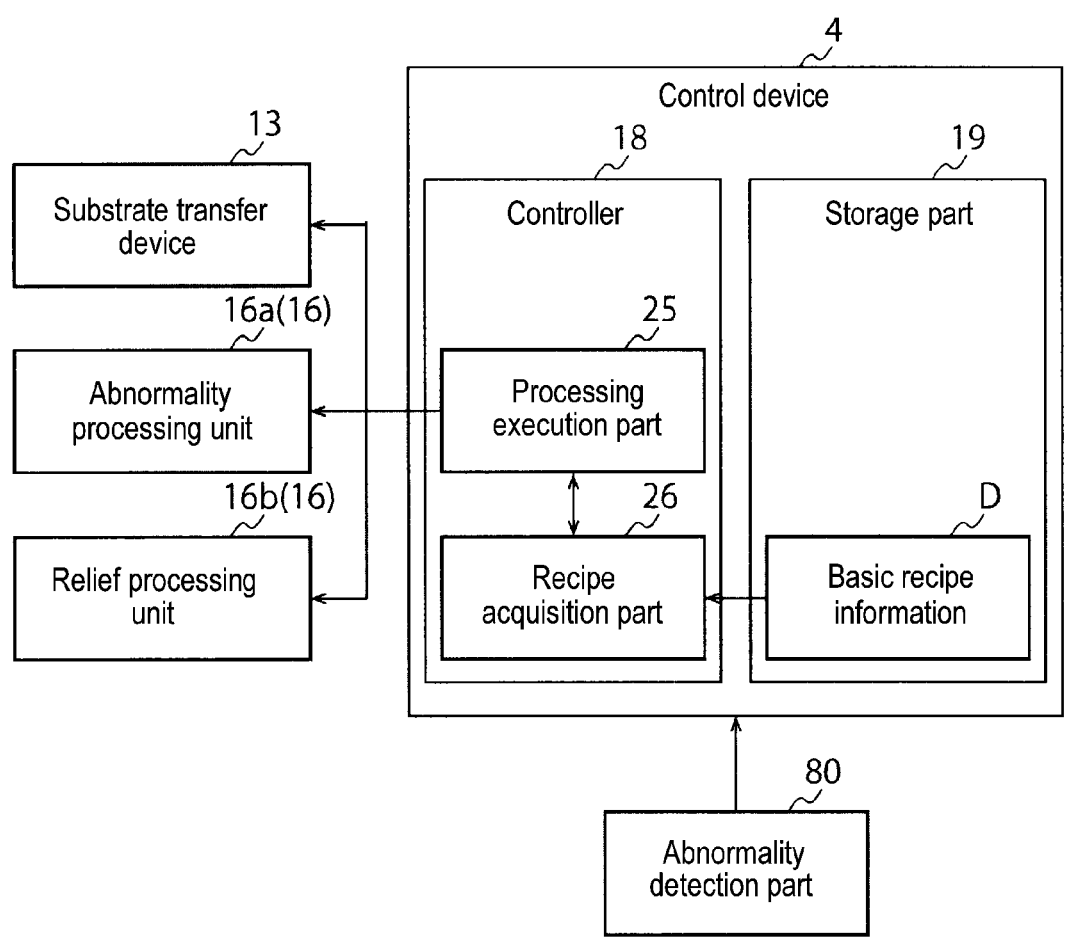
FIG. 4 is a diagram illustrating a functional configuration example of a control device.

FIG. 4 is a diagram illustrating a functional configuration example of the control device 4. Further, only a functional configuration related to a process in the occurrence of an abnormality occurs is illustrated in FIG. 4, and other functional configurations will be omitted in FIG. 4.

The controller 18 includes a processing execution part 25 and a recipe acquisition part 26. Each of the processing execution part 25 and the recipe acquisition part 26 may be configured by arbitrary hardware and/or software. The processing execution part 25 and the recipe acquisition part 26 may be configured by different devices (a calculation processing device, a storage device, and the like), or may be configured by partially or entirely common devices.

The recipe acquisition part 26 acquires recipe information indicating contents of a process performed by each processing unit 16. The recipe acquisition part 26 of the present embodiment reads basic recipe information D stored in the storage part 19 and acquires processing recipe information, relief recipe information, and complementary recipe information. The processing recipe information is recipe information indicating contents of a normal process performed when no abnormality occurs, and may be identical to the processing contents included in the basic recipe information D. The relief recipe information and the complementary recipe information are recipe information indicating contents of a process performed when an abnormality occurs, and are obtained based on the basic recipe information D.

The relief recipe information and the complementary recipe information may include a process having exactly the same contents as those of a portion of a process included in the basic recipe information D, or may include a process having contents different from those of a portion or all of the process included in the basic recipe information D.

The data forms of the processing recipe information, the relief recipe information, and the complementary recipe information (and completion recipe information as described hereinbelow) are not limited, and these recipe information may be determined by information data different from each other or may be determined based on information data common to each other. For example, each of the processing recipe information, the relief recipe information, the complementary recipe information, and the completion recipe information may be configured by data indicating one or more processing contents to be executed among a plurality of processing contents included in the basic recipe information D. The basic recipe information D includes the plurality of processing contents, and may also include the data indicating the processing contents to be executed among the plurality of processing contents in association with each processing recipe.

The processing execution part 25 controls the substrate transfer device 17 and each processing unit 16 based on the processing recipe information, the relief recipe information, and the complementary recipe information acquired by the recipe acquisition part 26. The processing recipe information indicates the contents of a normal substrate processing process, the relief recipe information indicates the contents of a relief processing process, and the complementary recipe information indicates the contents of a complementary processing process. For a processing unit 16 in which no abnormality occurs, the substrate process (i.e., the substrate processing process) based on the processing recipe information is performed. On the other hand, for a processing unit 16 in which an abnormality occurs (hereinafter, also referred to as an "abnormality processing unit 16a"), the substrate process (i.e., the relief processing process) based on the relief recipe information is performed. Furthermore, a wafer W which is being processed by the abnormality processing unit 16a (hereinafter, also referred to a "relief wafer (relief substrate)") is subjected to the substrate process (i.e., the complementary processing process) based on the complementary recipe information in other processing unit 16 (hereinafter, also referred to as a "relief processing unit 16b").

An abnormality detection part 80 is connected to the control device 4. The abnormality detection part 80 may be configured to detect an abnormality that occurs in each processing unit 16. When detecting the abnormality, the abnormality detection part 80 transmits an abnormality detection signal to the control device 4. When the control device 4 receives the abnormality detection signal, the control device 4 controls the processing execution part 25 and the recipe acquisition part 26 to perform control according to the abnormality detection signal.

As an example, the abnormality detection part 80 may be configured to detect an abnormality in a flow rate of the processing fluid (the chemical liquid or the like) in the processing fluid supply part 40, an abnormality in an adjuster (an opening/closing valve, a flow rate adjustment valve, or the like) which adjusts the flow rate of the processing fluid in the processing fluid supply part 40, or other abnormality (for example, leakage of the processing fluid or the like) in the flow of the processing fluid in the processing fluid supply part 40. Furthermore, the abnormality detection part 80 may be configured by a residual amount detection part which detects the residual amount of the chemical liquid stored in the chemical liquid source (for example, the DHF source 71*a* and the SC1 source 72*a* illustrated in FIG. 3). For example, when the residual amount of the chemical liquid stored in the chemical liquid source falls below a threshold value, the abnormality detection part 80 may transmit a notification that an abnormality has occurred to the controller 18.

Furthermore, although the abnormality detection part 80 is installed independently of the control device 4 (particularly, the controller 18) in the present embodiment, the abnormality detection part 80 may also be installed as a portion of the control device 4 (for example, the controller 18). The abnormality detection part 80 installed as a portion of the control device 4 can detect whether or not an abnormality occurs by, for example, receiving and analyzing detection data transmitted from a sensor (not shown). The sensor may detect, for example, the flow rate of the processing fluid in the processing fluid supply part 40, the state of the adjuster which adjusts the flow rate of the processing fluid in the processing fluid supply part 40, and/or the residual amount of the chemical liquid stored in the chemical liquid source. Furthermore, the leakage of the processing fluid to the outside of the processing unit 16 may be detected by a leakage sensor. In such a case, a pH value of the leaked processing fluid may be detected, and a notification that the abnormality has occurred may be given according to the detected pH value.

Figure 5:
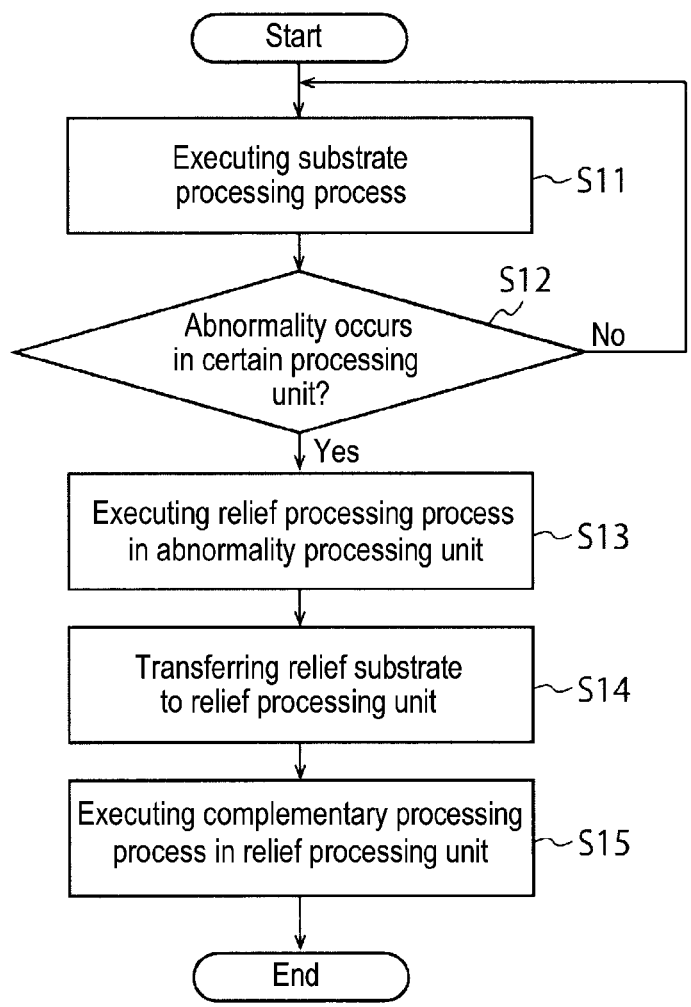
FIG. 5 is a flowchart illustrating an overall flow of an example of a substrate processing method according to a first embodiment of the present disclosure.

FIG. 5 is a flowchart illustrating an overall flow of an example of a substrate processing method according to a first embodiment of the present disclosure.

The processing execution part 25 of the controller 18 controls the substrate transfer device 13, the delivery part 14, and the substrate transfer device 17 (the transfer part 15) so as to pick up the wafer W from the carrier C and accommodate the same in an assigned processing unit 16. Then, the processing execution part 25 controls the substrate transfer device 17, and the substrate holding mechanism 30 and the processing fluid supply part 40 of each processing unit 16 according to the processing recipe information so as to execute the substrate processing process in each processing unit 16 (S11 in FIG. 5). The substrate processing process includes a substrate chemical liquid process of supplying a chemical liquid to the wafer W, a substrate rinsing process of supplying a rinsing liquid to the wafer W to wash away the chemical liquid, and a substrate drying process of drying the wafer W after the substrate rinsing process.

Figure 6:
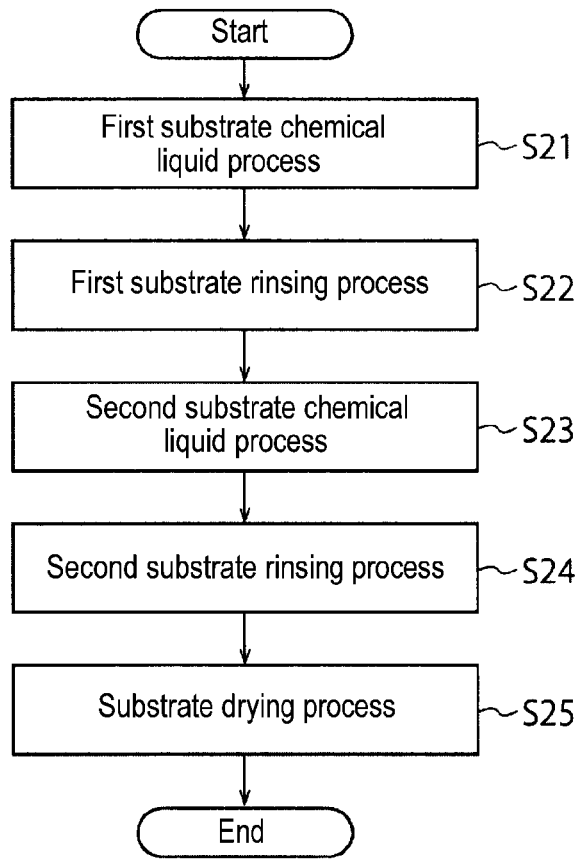
FIG. 6 is a flowchart illustrating an example of a substrate processing process.

FIG. 6 is a flowchart illustrating an example of the substrate processing process. In the present embodiment, a first substrate chemical liquid process (S21 in FIG. 6), a first substrate rinsing process (S22), a second substrate chemical liquid process (S23), a second substrate rinsing process (S24), and a substrate drying process (S25) are sequentially performed on each wafer W in the assigned processing unit 16. Therefore, the second substrate rinsing process (S24) is a final rinsing process performed immediately before the substrate drying process (S25), and not only serves to wash away the chemical liquid, but also serves as a pre-process for a subsequent substrate drying process.

Furthermore, the substrate processing process illustrated in FIG. 6 is merely an example, and the process may be performed in another flow, and the contents of each process are not limited. For example, a first chemical liquid used in the first substrate chemical liquid process and a second chemical liquid used in the second substrate chemical liquid process are not limited, and may be identical to or different from each other. Similarly, a first rinsing liquid used in the first substrate rinsing process and a second rinsing liquid used in the second substrate rinsing process are not limited, and may be identical to or different from each other. Each process may include a plurality of processing steps. For example, the first substrate chemical liquid process and/or the second substrate chemical liquid process may include a plurality of processing steps using a plurality of kinds of chemical liquids. In addition, the first substrate rinsing process and/or the second substrate rinsing process may include a plurality of processing steps using a plurality of kinds of rinsing liquids. Furthermore, the substrate drying process may include a processing step of applying a drying agent (for example, IPA) to the wafer W and a processing step of removing the drying agent from the wafer W by spin drying or the like.

The processing execution part 25 monitors whether or not an abnormality occurs in each processing unit 16 based on the detection result of the abnormality detection part 80 while the substrate processing process is being executed (S12 in FIG. 5). If it is determined that no abnormality occurs ("No" in S12), the substrate processing process is continued in each processing unit 16 (S11).

On the other hand, if it is determined that an abnormality occurs in a processing unit 16 and the substrate processing process for a target wafer W (relief wafer) cannot be completed ("Yes" in S12), the processing execution part 25 executes the relief processing process in the respective processing unit 16 (S13). That is, the processing execution part 25 controls the substrate holding mechanism 30 and the processing fluid supply part 40 of the abnormality processing unit 16*a* according to the relief recipe information so as to execute the relief processing process on the relief wafer in the abnormality processing unit 16*a* after the occurrence of the abnormality.

The relief processing process is determined according to the contents of a process which has been performed on the relief wafer at the time of the occurrence of the abnormality, and may include various processes. As an example, when an abnormality occurs during the first substrate chemical liquid process (S21 in FIG. 6), the processing execution part 25 may skip the rest of the first substrate chemical liquid process and perform the first substrate rinsing process (S22) according to the relief processing process. Thereafter, the processing execution part 25 may skip the second substrate chemical liquid process (S23) and perform the second substrate rinsing processing (S24) and the substrate drying processing (S25). Furthermore, when an abnormality occurs during the first substrate rinsing process (S22), the processing execution part 25 may skip the rest of the first substrate rinsing process (S22) and the second substrate chemical liquid process (S23) and perform the second substrate rinsing process (S24) and the substrate drying process (S25) according to the relief processing process. In addition, when an abnormality occurs during the second substrate chemical liquid process (S23), the processing execution part 25 may skip the rest of the second substrate chemical liquid process (S23) and perform the second substrate rinsing process (S24) and the substrate drying process (S25) according to the relief processing process. Furthermore, when an abnormality occurs during the second substrate rinsing process (S24: i.e., the final rinsing process), the processing execution part 25 may perform the second substrate rinsing process (S24) and the substrate drying process (S25) according to the relief processing process. Moreover, when an abnormality occurs during the substrate drying process (S25), the processing execution part 25 may perform the second substrate rinsing process (S24) and the substrate drying process (S25) according to the relief processing process.

After the relief processing process is performed, the relief wafer is transferred from the abnormality processing unit 16a to the relief processing unit 16b (S14 in FIG. 5) and is subjected to the complementary processing process in the relief processing unit 16b (S15). That is, the processing execution part 25 controls the substrate transfer device 17 and the substrate holding mechanism 30 and the processing fluid supply part 40 of the relief processing unit 16b according to the complementary recipe information. In this manner, the relief wafer is transferred to the relief processing unit 16b, which is a normal processing unit 16 different from the abnormality processing unit 16a, and the complementary processing process for the relief wafer is executed in the relief processing unit 16b.

Figure 7:
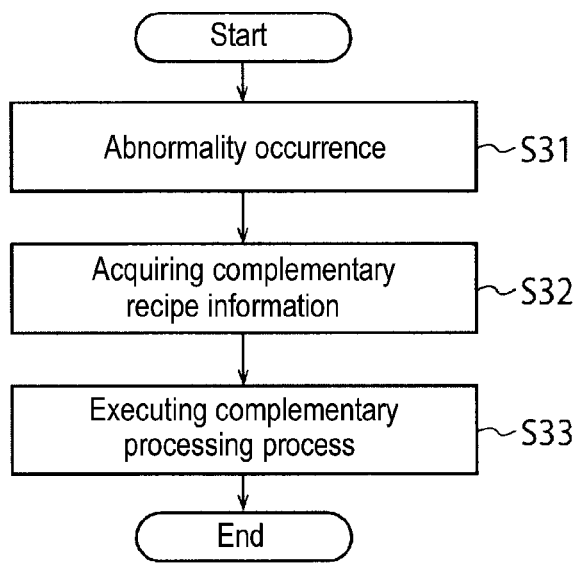
FIG. 7 is a flowchart illustrating an example of a flow from occurrence of an abnormality to execution of a complementary processing process.

FIG. 7 is a flowchart illustrating an example of a flow from the occurrence of an abnormality to the execution of the complementary processing process. A process included in the complementary processing process is determined according to the contents of a process which has been actually performed on the relief wafer in the abnormality processing unit 16a. When the occurrence of an abnormality in the abnormality processing unit 16a is detected by the abnormality detection part 80 (S31 in FIG. 7), the recipe acquisition part 26 acquires complementary recipe information based on the basic recipe information D (S32). At this time, the recipe acquisition part 26 may acquire the contents of the process which has been actually performed on the relief wafer in the abnormality processing unit 16a from the processing execution part 25 and use the same to create the complementary recipe information. The processing execution part 25 executes the complementary processing process on the relief wafer in the relief processing unit 16b based on the complementary recipe information acquired by the recipe acquisition part 26 (S33).

Furthermore, the specific contents of the process included in the complementary processing process are not limited. Typically, the processing contents of the complementary processing process are determined based on the contents of the process included in the substrate processing process. A processing step interrupted by the occurrence of an abnormality (hereinafter, also referred to as an "interruption processing step") and processing steps after the interruption processing step included in the substrate processing process may be included in the complementary processing process. Therefore, the complementary processing process may include, for example, a complementary chemical liquid process of completing the substrate chemical liquid process on the relief wafer. Furthermore, when the processing step immediately before the interruption processing step (for example, the substrate chemical liquid process) is the substrate rinsing process, the complementary processing process may include the substrate rinsing process immediately before the interruption processing step and the interruption processing step performed after the substrate rinsing process. By processing the relief wafer in the order of the substrate rinsing process and the interruption processing step in the complementary processing process, the interruption processing step may be performed after the state of the processing surface of the relief wafer is properly adjusted (i.e., after proper pre-wetting) even in the complementary processing process. Furthermore, when the processing step immediately before the interruption processing step (for example, the substrate chemical liquid process) in the substrate processing process is not the substrate rinsing process, the substrate rinsing process may not be performed prior to the interruption processing step in the complementary processing process.

Figure 8:
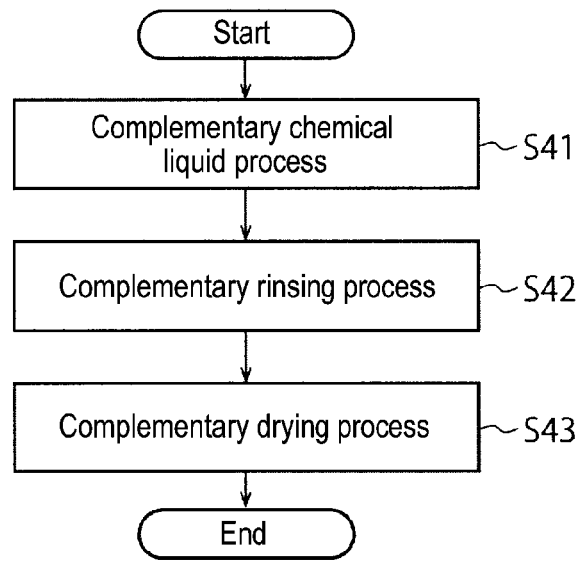
FIG. 8 is a flowchart illustrating an example of the complementary processing process.

FIG. 8 is a flowchart illustrating an example of the complementary processing process. According to the complementary processing process illustrated in FIG. 8, the relief wafer is subjected to a sequence of a complementary chemical liquid process (S41 in FIG. 8), a complementary rinsing process (S42), and a complementary drying process (S43) in the relief processing unit 16b. The complementary chemical liquid process is a process of applying a chemical liquid to the relief wafer, the complementary rinsing process is a process of applying a rinsing liquid to the relief wafer, and the complementary drying process is a process of drying the relief wafer. For example, when an abnormality occurs in the second substrate chemical liquid process (S23 in FIG. 6), or when an abnormality occurs in any of the first substrate chemical liquid process (S21) and the second substrate chemical liquid process (S23) using the same chemical liquid, the complementary processing process illustrated in FIG. 8 is useful. In addition, the complementary processing process illustrated in FIG. 8 is merely an example, and the complementary processing process may include, for example, a plurality of complementary chemical liquid processes, or may include processes not shown.

The relief processing unit 16b is not limited, but may be any processing unit 16 capable of executing the complementary processing process. For example, a normal processing unit 16 having the same configuration as the abnormality processing unit 16a may be appropriately used as the relief processing unit 16b. The controller 18 (for example, the processing execution part 25) may select the relief processing unit 16b according to the substrate processing process of the entire plurality of wafers W placed on the carrier placement part 11. Typically, the order of the process (particularly, the substrate processing process) is assigned to each of the plurality of wafers W, and a processing unit 16 corresponding to the order of the process is assigned to each of the plurality of wafers W. The complementary processing process for the relief wafer may be performed after completion of the substrate processing process for all unprocessed wafers W, or may be performed prior to the substrate processing process for a portion or all of the unprocessed wafers W. In this manner, a new processing order for performing the complementary processing process is assigned to the relief wafer, and a processing unit 16 corresponding to the new processing order may be used as the relief processing unit 16b.

In this manner, the controller 18 (for example, the processing execution part 25) reassigns the priority order of the process to the unprocessed wafers W and the relief wafer when an abnormality occurs in a certain processing unit 16 (i.e., the abnormality processing unit 16a). When this reassignment is performed, the abnormality processing unit 16a is excluded from the assignable processing units 16. The controller 18 (for example, the processing execution part 25) controls the substrate transfer device 17 so that no wafer W is transferred to the abnormality processing unit 16a after the occurrence of the abnormality.

Second Embodiment

In the present embodiment, the same or similar elements as those in the aforementioned first embodiment will be denoted by the same reference numerals and a detailed description thereof will be omitted.

Also, in the present embodiment, similar to the aforementioned first embodiment, when an abnormality occurs in a certain processing unit 16, the relief processing process and the complementary processing process are executed. However, a process included in the complementary processing process of the present embodiment is determined based on a time interval from the completion of the relief processing process to the start of the execution of the complementary processing process.

Figure 9:
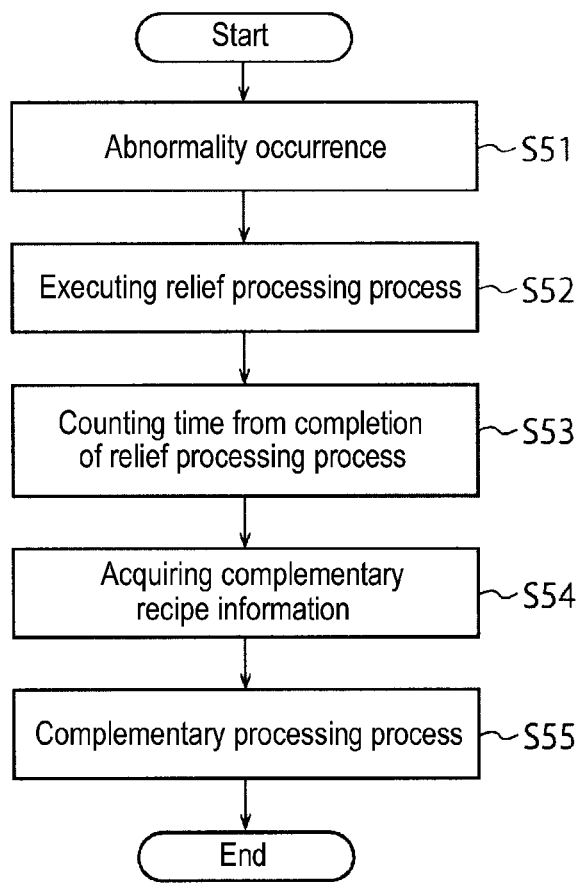
FIG. 9 is a flowchart illustrating a flow of an example of a substrate processing method according to a second embodiment of the present disclosure.

FIG. 9 is a flowchart illustrating a flow of an example of a substrate processing method according to a second embodiment of the present disclosure.

When an abnormality occurs in a certain processing unit 16 while the substrate processing process is being executed in each processing unit 16 (S51 in FIG. 9), the processing execution part 25 executes the relief processing process in the respective abnormality processing unit 16*a* (S52).

Then, the controller 18 (for example, the recipe acquisition part 26) counts an elapsed time after the completion of the relief processing process for the relief wafer (S53). Accordingly, the controller 18 acquires elapsed time information directly or indirectly indicating the time from the completion of the relief processing process for the relief wafer to the start of the complementary processing process. It is preferable that the controller 18 acquires elapsed time information accurately indicating the time from the completion of the relief processing process for the relief wafer to the start of the complementary processing process. However, the controller 18 does not necessarily need to count a total time from the completion of the relief processing process to the start of the complementary processing process. That is, the elapsed time information does not have to indicate the exact time from the completion of the relief processing process to the start of the complementary processing process. For example, when the relief wafer is placed in a predetermined storage location from the completion of the relief processing process to the start of the complementary processing process, the controller 18 may acquire information indicating the time during which the relief wafer is placed in the storage location as the elapsed time information.

Then, the recipe acquisition part 26 acquires complementary recipe information based on the elapsed time information of the relief wafer (S54). For example, when the time from the completion of the relief processing process to the start of the complementary processing process is relatively long, it is expected that the relief wafer is oxidized during a waiting time and an unintended oxide film is formed on the relief wafer at the start of the complementary processing process. The recipe acquisition part 26 of the present embodiment creates the complementary recipe information based on the elapsed time information so that removal of such unintended oxide film is also performed in the complementary processing process. Specifically, the complementary processing process may include an oxide film removal process. When the oxide film removal process is included in the original complementary processing process, an amount of the chemical liquid to be applied to the relief wafer and/or a time for the oxide film removal process are determined in the complementary processing process in consideration of the removal amount of the unintended oxide film, in addition to the removal amount of the original oxide film.

The processing execution part 25 executes the complementary processing process for the relief wafer in the relief processing unit 16*b* according to the complementary recipe information acquired by the recipe acquisition part 26 in this way (S55). Thus, it is also possible to remove unintended deterioration of the relief wafer which occurs after the completion of the relief processing process in the complementary processing process.

Third Embodiment

In the present embodiment, the same or similar elements as those in the aforementioned first or second embodiment will be denoted by the same reference numerals and a detailed description thereof will be omitted.

The controller 18 (for example, the processing execution part 25) of the present embodiment determines whether or not to execute the complementary processing process for the relief wafer based on the contents of the process which has been performed on the relief wafer in the abnormality processing unit 16*a* until just before the occurrence of the abnormality. When it is determined to execute the complementary processing process, the controller 18 controls the substrate transfer device 17 and the relief processing unit 16*b* according to the complementary recipe information so as to execute the complementary processing process by transferring the relief wafer to the relief processing unit 16*b*. On the other hand, when it is determined not to execute the complementary processing process, the controller 18 controls the substrate transfer device 17 and the relief processing unit 16*b* according to the completion recipe information so as to execute the completion processing process, instead of the complementary processing process, on the relief wafer. The completion recipe information is acquired based on the basic recipe information D by the recipe acquisition part 26. The recipe acquisition part 26 may create the completion recipe information based on the process which has been performed on the relief wafer at the time of the occurrence of the abnormality.

Figure 10:
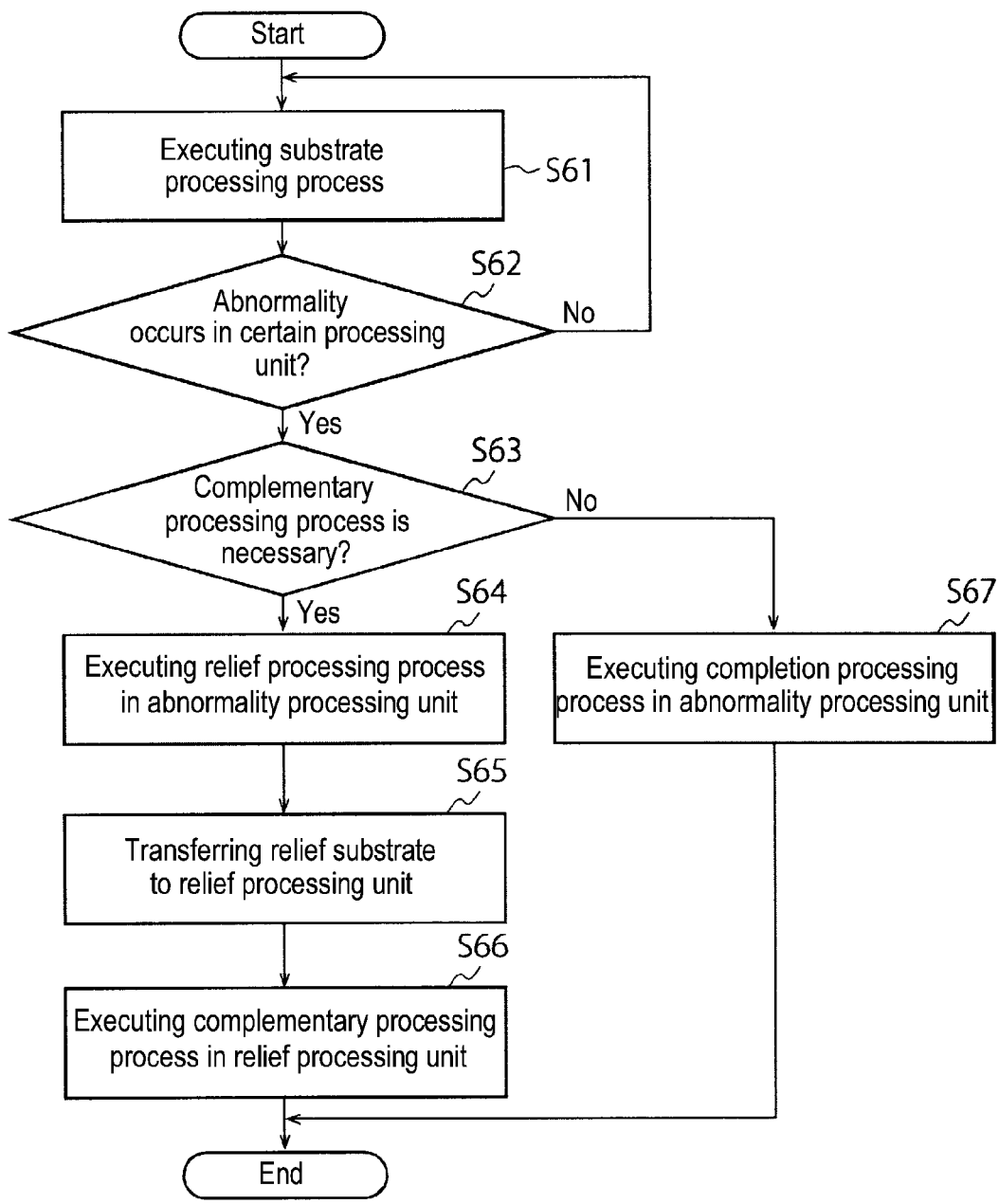
FIG. 10 is a flowchart illustrating a flow of an example of a substrate processing method according to a third embodiment of the present disclosure.

FIG. 10 is a flowchart illustrating a flow of an example of a substrate processing method according to a third embodiment of the present disclosure.

Similar to the first embodiment described above, also in the present embodiment, the processing execution part 25 monitors whether or not an abnormality occurs in each processing unit 16 based on a detection result of the abnormality detection part 80 while the substrate processing process is being executed (see S61 and S62 in FIG. 10). If it is determined that no abnormality occurs ("No" in S62), the substrate processing process is continued in each processing unit 16 (S61).

On the other hand, if it is determined that an abnormality occurs in a certain processing unit 16 and the substrate processing process for the relief wafer cannot be completed ("Yes" in S62), the processing execution part 25 determines whether or not the execution of the complementary processing process for the relief wafer is necessary (S63). The determination is performed based on the contents of the process which has been performed on the relief wafer by the abnormality processing unit 16*a* until before the occurrence of the abnormality, and is performed based on whether or not a certain degree of process has been already performed on the relief wafer. A specific standard for determination is determined according to specific processing contents of the substrate processing process and required degree of processing quality.

For example, when the process which has been performed on the relief wafer at the time of occurrence of an abnormality is the chemical liquid process using the first chemical liquid (hereinafter, also referred to as an "abnormality chemical liquid process"), it is possible to determine whether or not the execution of the complementary processing process for the relief wafer is necessary based on the following conditions. That is, in order to determine that the complementary processing process is unnecessary, it may be set to a condition under which the abnormality chemical liquid process corresponds to the last process of the process using the first chemical liquid in the substrate processing process. In addition, in order to determine that the complementary processing process is unnecessary, it may be set to a condition under which a predetermined ratio (for example, 90%) or more of a total amount of the first chemical liquid to be essentially used in the abnormality chemical liquid process is already applied to the relief wafer. That is, when the predetermined ratio or more of the total amount of the first chemical liquid to be used in the substrate chemical liquid process (i.e., the abnormality chemical liquid process) is already supplied to the relief wafer until just before the occurrence of an abnormality, the controller 18 may determine that the complementary processing process is not executed. As described above, it may be determined that the complementary processing process is unnecessary only when the predetermined ratio or more of the total amount of the first chemical liquid to be essentially applied to the wafer W in the abnormality chemical liquid process is already applied to the relief wafer at the time of occurrence of an abnormality.

In this example, when the abnormality chemical liquid process corresponds to the last process of the chemical liquid processing process using the first chemical liquid as described above and the predetermined amount or more of the first chemical liquid is already applied to the relief wafer at the time of occurrence of an abnormality, it is determined that the complementary processing process is unnecessary ("No" in S63). On the other hand, when the abnormality chemical liquid process does not correspond to the last process of the chemical liquid process using the first chemical liquid, or when only a smaller amount of the first chemical liquid than the predetermined amount is applied to the relief wafer at the time of occurrence of an abnormality, it is determined that the complementary processing process is necessary ("Yes" in S63).

If it is determined that the complementary processing process is necessary ("Yes" in S63), the relief processing process for the relief wafer is executed in the abnormality processing unit 16a (S64) as in the first embodiment described above. Then, the relief wafer is transferred to the relief processing unit 16b (S65) so that the complementary processing process for the relief wafer is executed in the relief processing unit 16b (S66). In addition, as in the second embodiment described above, the contents of the process included in the complementary processing process may be determined based on a time from the completion of the relief processing process to the start of the complementary processing process.

On the other hand, if it is determined that the complementary processing process is unnecessary ("No" in S63), the processing execution part 25 executes the completion processing process on the relief wafer in the abnormality processing unit 16a according to the completion recipe information (S67). The completion processing process includes a process for discharging the relief wafer as a processed wafer W. The completion recipe information indicates the processing contents of the completion processing process. The contents of the completion processing process are determined according to the contents of the substrate processing process. Typically, in the completion processing process, the rest of a processing step (hereinafter, also referred to as an "abnormality processing step") which is being performed at the time of occurrence of an abnormality is skipped, but processing steps after the abnormality processing step in the substrate processing process are performed.

Figure 11:
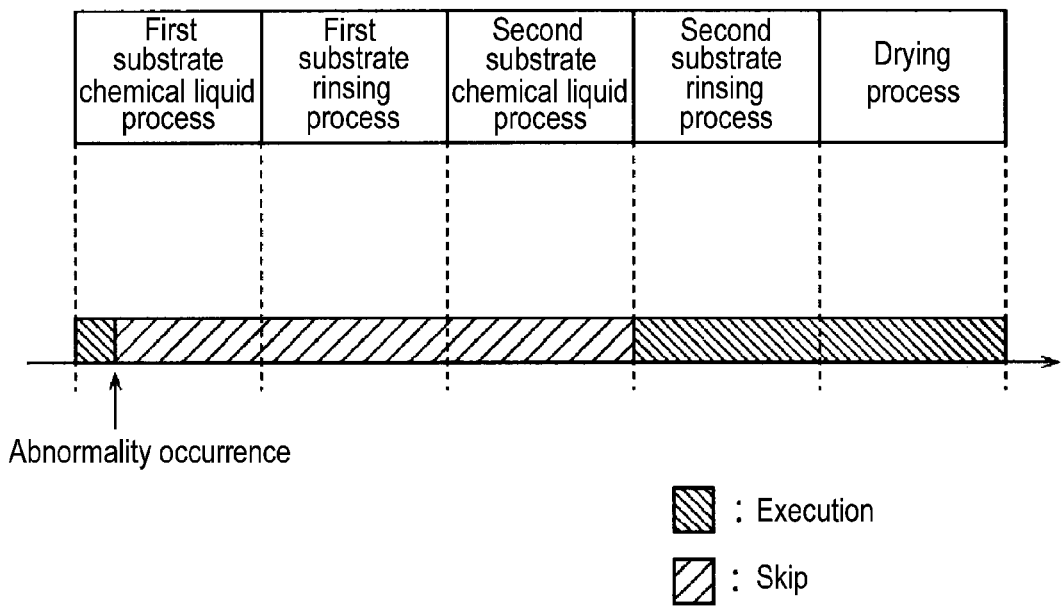
FIG. 11 is a diagram illustrating a processing example of a relief processing process performed when it is determined that the complementary processing process is necessary.
Figure 12:
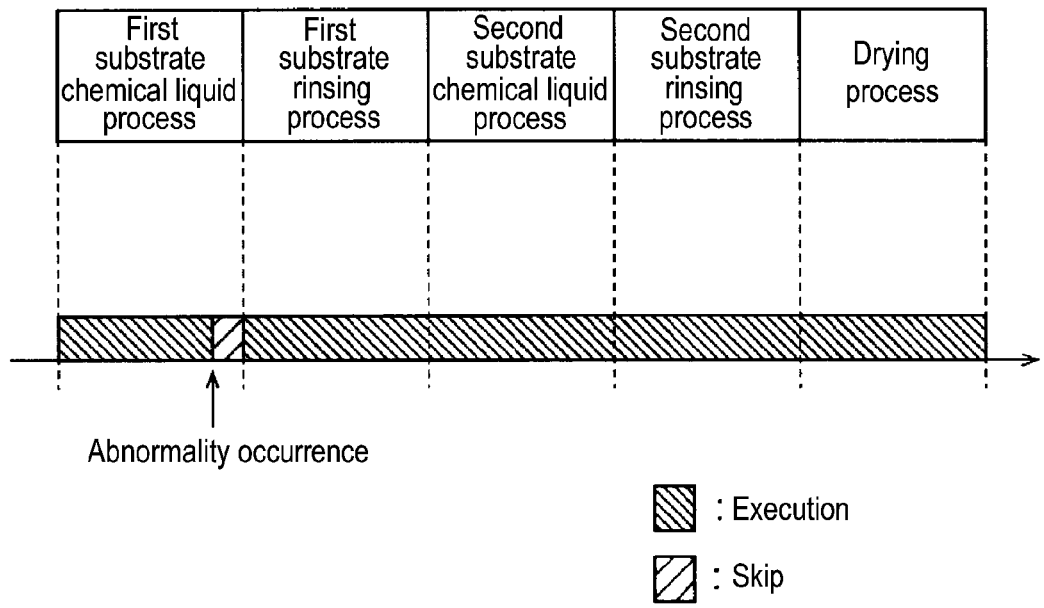
FIG. 12 is a diagram illustrating a processing example of a completion processing process performed when it is determined that the complementary processing process is unnecessary.

FIG. 11 is a diagram illustrating a processing example of the relief processing process performed when it is determined that the complementary processing process is necessary. FIG. 12 is a diagram illustrating a processing example of the completion processing process performed when it is determined that the complementary processing process is unnecessary. FIGS. 11 and 12 illustrate a case where an abnormality occurs in the first substrate chemical liquid process when the first chemical liquid used in the first substrate chemical liquid process and the second chemical liquid used in the second substrate chemical liquid process are different from each other.

As described above, FIG. 11 illustrates a case where only a smaller amount of the first chemical liquid than a predetermined ratio (for example, 90%) of the amount of the first chemical liquid to be used in the first substrate chemical liquid process is applied to the relief wafer at the time of occurrence of an abnormality. On the other hand, FIG. 12 illustrates a case where the first chemical liquid of an amount, which is equal to or more than the predetermined ratio of the amount of the first chemical liquid to be used in the first substrate chemical liquid process at the time of occurrence of an abnormality, is already applied to the relief wafer.

As illustrated in FIG. 11, when an abnormality that requires the complementary processing process occurs during the first substrate chemical liquid process, the processing execution part 25 may skip the rest of the first substrate chemical liquid process, and the execution of the first substrate rinsing process and the second substrate chemical liquid process according to the relief recipe information. Then, the processing execution part 25 may execute the second substrate rinsing process, which is the final rinsing process, and the drying process on the relief wafer according to the relief processing recipe.

On the other hand, as illustrated in FIG. 12, when an abnormality that does not require the complementary processing process occurs during the first substrate chemical liquid process, the processing execution part 25 may skip only the execution of the rest of the first substrate chemical liquid process according to the completion recipe information. Then, the processing execution part 25 may execute a subsequent first substrate rinsing process, a subsequent second substrate chemical liquid process, a subsequent second substrate rinsing process, and a subsequent drying process on the relief wafer.

As described above, according to the substrate processing system 1 and the substrate processing method described above, even when the substrate process which is being executed is interrupted due to the occurrence of an abnormality, it is possible to recover the substrate which is being processed (i.e., the relief wafer) as a usable substrate.

In particular, by determining a process included in the complementary processing process according to the contents of the process which has been actually performed on the relief wafer in the abnormality processing unit 16a, it is possible to perform an adaptive complementary processing process according to the state of the relief wafer.

For example, the complementary processing process includes a complementary chemical liquid process for completing the substrate chemical liquid process for the relief wafer. Thus, a chemical liquid process similar to a conventional chemical liquid process for the wafer W may also be applied to the relief wafer.

Furthermore, by performing the complementary processing process after performing the relief processing process on the relief wafer, it is possible to improve the processing accuracy of the complementary processing process.

In particular, by determining the process included in the complementary processing process based on the time from the completion of the relief processing process to the start of the complementary processing process, it is also possible to remove the deterioration such as oxidation or the like caused on the relief wafer from the completion of the relief processing process to the start of the complementary processing process.

In addition, by determining the relief processing process according to the contents of the process which has been performed on the relief wafer at the time of occurrence of an abnormality, it is possible to perform an adaptive relief processing process according to the state of the relief wafer.

Moreover, by determining whether or not to execute the complementary processing process based on the contents of the process which has been performed on the relief wafer until just before the occurrence of an abnormality, it is possible to improve the efficiency of the process of the relief wafer after the occurrence of an abnormality.

Furthermore, by preventing the wafer W from being transferred to the abnormality processing unit 16a after the occurrence of an abnormality, it is possible to prevent the occurrence of a defect in a substrate process for a subsequent wafer W in advance.

It should be noted that the embodiments disclosed herein are exemplary in all respects and are not restrictive. The above-described embodiments may be omitted, replaced or modified in various forms without departing from the scope and spirit of the appended claims. For example, the aforementioned embodiments and modifications may be combined with each another, and embodiments other than the aforementioned embodiments may be combined with the aforementioned embodiments or modifications.

Furthermore, a technical category that embodies the technical idea described above is not limited. For example, the substrate processing system described above may be applied to other apparatuses. In addition, the technical idea described above may be embodied by a computer program for causing a computer to execute one or more procedures (steps) included in the substrate processing method described above. Moreover, the technical idea described above may be embodied by a non-transitory computer-readable recording medium recording such a computer program.

According to the present disclosure in some embodiments, it is possible to advantageously recover a substrate being processed as a usable substrate when a substrate process being performed is interrupted at the time of occurrence of an abnormality.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a substrate transfer device configured to transfer a substrate;
a plurality of processing units, each having a substrate holding mechanism configured to rotatably hold the substrate received from the substrate transfer device and a processing fluid supply part configured to supply a processing fluid to the substrate held by the substrate holding mechanism; and
a controller configured to control the substrate transfer device and the plurality of processing units according to processing recipe information indicating contents of a substrate processing process so as to execute the substrate processing process including a substrate chemical liquid process of supplying a chemical liquid to the substrate, a substrate rinsing process of supplying a rinsing liquid to the substrate, and a substrate drying process of drying the substrate,
wherein, when an abnormality in a certain processing unit of the plurality of processing units occurs in the substrate processing process for the substrate to be processed, the controller is configured to control the substrate transfer device and a relief processing unit according to complementary recipe information indicating contents of a complementary processing process so that the complementary processing process for a relief substrate is executed in the relief processing unit by transferring the relief substrate which is the substrate to be processed to the relief processing unit which is a processing unit different from the certain processing unit.

2. The substrate processing system of claim 1, wherein a process included in the complementary processing process is determined according to the contents of the process which has been actually performed on the relief substrate in the certain processing unit.

3. The substrate processing system of claim 2, wherein the complementary processing process includes a complementary chemical liquid process of completing the substrate chemical liquid process for the relief substrate.

4. The substrate processing system of claim 3, wherein the controller is configured to control the certain processing unit according to relief recipe information indicating contents of relief processing process so that the relief processing process for the relief substrate is executed in the certain processing unit after the occurrence of the abnormality.

5. The substrate processing system of claim 4, wherein a process included in the complementary processing process is determined based on a time from completion of the relief processing process to start of the execution of the complementary processing process.

6. The substrate processing system of claim 5, wherein the relief processing process is determined according to contents of the process which has been performed on the relief substrate at the time of occurrence of the abnormality.

7. The substrate processing system of claim 6, wherein the controller is configured to determine whether or not to execute the complementary processing process on the relief substrate based on contents of the process which has been performed on the relief substrate until just before the occurrence of the abnormality in the certain processing unit, and when it is determined to execute the complementary processing process, to control the substrate transfer device and the relief processing unit according to the complementary recipe information so as to execute the complementary processing process by transferring the relief substrate to the relief processing unit.

8. The substrate processing system of claim 7, wherein, when a predetermined ratio or more of a total amount of the chemical liquid to be used in the substrate chemical liquid process is already supplied to the relief substrate until just before the occurrence of the abnormality, the controller is configured to determine not to execute the complementary processing process.

9. The substrate processing system of claim 8, wherein, after the occurrence of the abnormality, the controller is configured to control the substrate transfer device so that the substrate is not transferred to the certain processing unit.

10. The substrate processing system of claim 1, wherein the controller is configured to control the certain processing unit according to relief recipe information indicating contents of relief processing process so that the relief processing process for the relief substrate is executed in the certain processing unit after the occurrence of the abnormality.

11. The substrate processing system of claim 1, wherein the controller is configured to determine whether or not to execute the complementary processing process on the relief substrate based on contents of the process which has been performed on the relief substrate until just before the occurrence of the abnormality in the certain processing unit, and when it is determined to execute the complementary processing process, to control the substrate transfer device and the relief processing unit according to the complementary recipe information so as to execute the complementary processing process by transferring the relief substrate to the relief processing unit.

12. The substrate processing system of claim 1, wherein, after the occurrence of the abnormality, the controller is configured to control the substrate transfer device so that the substrate is not transferred to the certain processing unit.

13. A substrate processing method, comprising:
controlling, according to processing recipe information, a substrate transfer device configured to transfer a substrate; and a plurality of processing units, each having a substrate holding mechanism configured to rotatably hold the substrate received from the substrate transfer device and a processing fluid supply part configured to supply a processing fluid to the substrate held by the substrate holding mechanism, so as to execute a substrate processing process including a substrate chemical liquid process of supplying a chemical liquid to the substrate, a substrate rinsing process of supplying a rinsing liquid to the substrate, and a substrate drying process of drying the substrate; and
controlling, when an abnormality in a certain processing unit of the plurality of processing units occurs in the substrate processing process for the substrate to be processed, the substrate transfer device and a relief processing unit which is a processing unit different from the certain processing unit according to complementary recipe information so that a complementary processing process for a relief substrate is executed in the relief processing unit by transferring the relief substrate which is the substrate to be processed to the relief processing unit.

* * * * *